United States Patent
Goumballa et al.

(10) Patent No.: US 9,628,093 B2
(45) Date of Patent: Apr. 18, 2017

(54) CHARGE PUMP CIRCUIT, PHASE LOCKED LOOP APPARATUS, INTEGRATED CIRCUIT, AND METHOD OF MANUFACTURE OF A CHARGE PUMP

(71) Applicants: Birama Goumballa, Balma (FR); Gilles Montoriol, Cugnaux (FR); Didier Salle, Toulouse (FR)

(72) Inventors: Birama Goumballa, Balma (FR); Gilles Montoriol, Cugnaux (FR); Didier Salle, Toulouse (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/899,499

(22) PCT Filed: Jul. 18, 2013

(86) PCT No.: PCT/IB2013/002411
§ 371 (c)(1),
(2) Date: Dec. 17, 2015

(87) PCT Pub. No.: WO2015/008108
PCT Pub. Date: Jan. 22, 2015

(65) Prior Publication Data
US 2016/0182064 A1    Jun. 23, 2016

(51) Int. Cl.
*H03L 7/06* (2006.01)
*H03L 7/089* (2006.01)
(Continued)

(52) U.S. Cl.
CPC ......... *H03L 7/0896* (2013.01); *H03K 17/567* (2013.01); *H03L 7/18* (2013.01)

(58) Field of Classification Search
None
See application file for complete search history.

(56) References Cited

U.S. PATENT DOCUMENTS

| | | |
|---|---|---|
| 5,532,636 A | 7/1996 | Mar et al. |
| 5,945,855 A | 8/1999 | Momtaz |
(Continued)

FOREIGN PATENT DOCUMENTS

| | | |
|---|---|---|
| JP | 2003150450 | 5/2003 |
| JP | 2009524140 | 6/2009 |
| KR | 100866951 | 5/2008 |

OTHER PUBLICATIONS

International Search Report for International application No. PCT/IB2013/055907 dated Apr. 28, 2014.
(Continued)

*Primary Examiner* — Lincoln Donovan
*Assistant Examiner* — Khareem E Almo

(57) ABSTRACT

A charge pump circuit comprises a first bipolar transistor device and a second bipolar switching device arranged in a differential pair configuration. A first terminal of each of the first and second bipolar switching devices are coupled to a supply. A second like terminal of each of the first and second bipolar switching devices are coupled together and to ground potential via a pulsed current source. A field effect switching device is also provided and the first terminal of the first bipolar switching device is coupled to the voltage supply via the field effect switching device.

19 Claims, 3 Drawing Sheets

(51) Int. Cl.
*H03K 17/567* (2006.01)
*H03L 7/18* (2006.01)

(56) References Cited

U.S. PATENT DOCUMENTS

| | | | |
|---|---|---|---|
| 6,288,660 B1 | 9/2001 | Nisbet | |
| 7,012,473 B1* | 3/2006 | Kokolakis | H03L 7/0896 327/148 |
| 7,135,894 B1* | 11/2006 | Stegers | H03K 17/04106 327/108 |
| 7,215,170 B1* | 5/2007 | Kang | H03K 3/012 327/199 |
| 7,285,992 B1* | 10/2007 | Maida | H03F 3/301 327/112 |
| 8,022,739 B2 | 9/2011 | Yan | |
| 8,988,119 B2* | 3/2015 | Danny | H03L 7/081 327/115 |
| 9,076,526 B2* | 7/2015 | Chung | G11C 15/04 |
| 2013/0049845 A1* | 2/2013 | Boomkamp | H03K 5/2418 327/535 |
| 2014/0097910 A1* | 4/2014 | Breslin | H03B 5/1231 331/114 |
| 2015/0279467 A1* | 10/2015 | Conte | G11C 16/0408 365/185.18 |

OTHER PUBLICATIONS

Thompson et al, "A 300-MHz BiCMOS serial data transceiver", IEEE Journal of Solid-State Circuits, Mar. 1994, pp. 185-192, vol. 29, Issue: 3.

Holdenried et al, "Analysis and design of HBT Cherry-Hooper amplifiers with emitter-follower feedback for optical communications", IEEE Journal of Solid-State Circuits, Nov. 2004, pp. 1959-1967, vol. 39, Issue: 11.

* cited by examiner

CHARGE PUMP CIRCUIT, PHASE LOCKED LOOP APPARATUS, INTEGRATED CIRCUIT, AND METHOD OF MANUFACTURE OF A CHARGE PUMP

FIELD OF THE INVENTION

This invention relates to a charge pump circuit, a phase locked loop apparatus, and integrated circuit and a method of manufacture of a charge pump.

BACKGROUND OF THE INVENTION

The use of Phase Locked Loop (PLL) circuits in electronic circuits is widespread throughout the field of electronics. For radar applications, particularly but not exclusively in the automotive industry, users of the PLLs in a radar device require particular operational parameters in order to achieve certain operational goals using the radar device. In this respect, known existing XOR-PLLs are designed for so-called Long Range Radar (LRR) applications where output signal modulation is relatively slow. However, as the modulation speed increases, phase noise of the radar device becomes increasingly important, because the phase noise affects noise density at a receiver IF output of the radar device. In this respect, so-called Short Range Radar (SRR) radar transmitters operate at a higher modulation frequency than LRR radar transmitters, for example 38 GHz vs. 77 GHz. Furthermore, radar devices can be required to support both LRR and SRR functionality and for such requirements, the Voltage Controlled Oscillator (VCO) of the PLL of the radar device requires a large frequency tuning range, for example around 10 GHz, at a relatively high tuning range voltage, for example around 5V.

In order to satisfy such performance requirements, the PLL can be a so-called charge pump PLL. However, a charge pump PLL comprising a charge pump formed solely from Field Effect Transistor (FET) devices is unable to satisfy the above-mentioned performance requirements due to the fact that the FET devices have limited switching speeds and require a standard supply voltage. Bipolar-Complementary Metal Oxide Semiconductor (BICMOS) circuits are known to overcome such encumbrances, but known BICMOS charge pump circuits nevertheless suffer from limited upper frequency range responses due to current derivation on the supply and ground of the charge pump circuit taking time to settle to a steady state.

SUMMARY OF THE INVENTION

The present invention provides a charge pump circuit, a phase locked loop apparatus, and integrated circuit and a method of manufacture of a charge pump as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
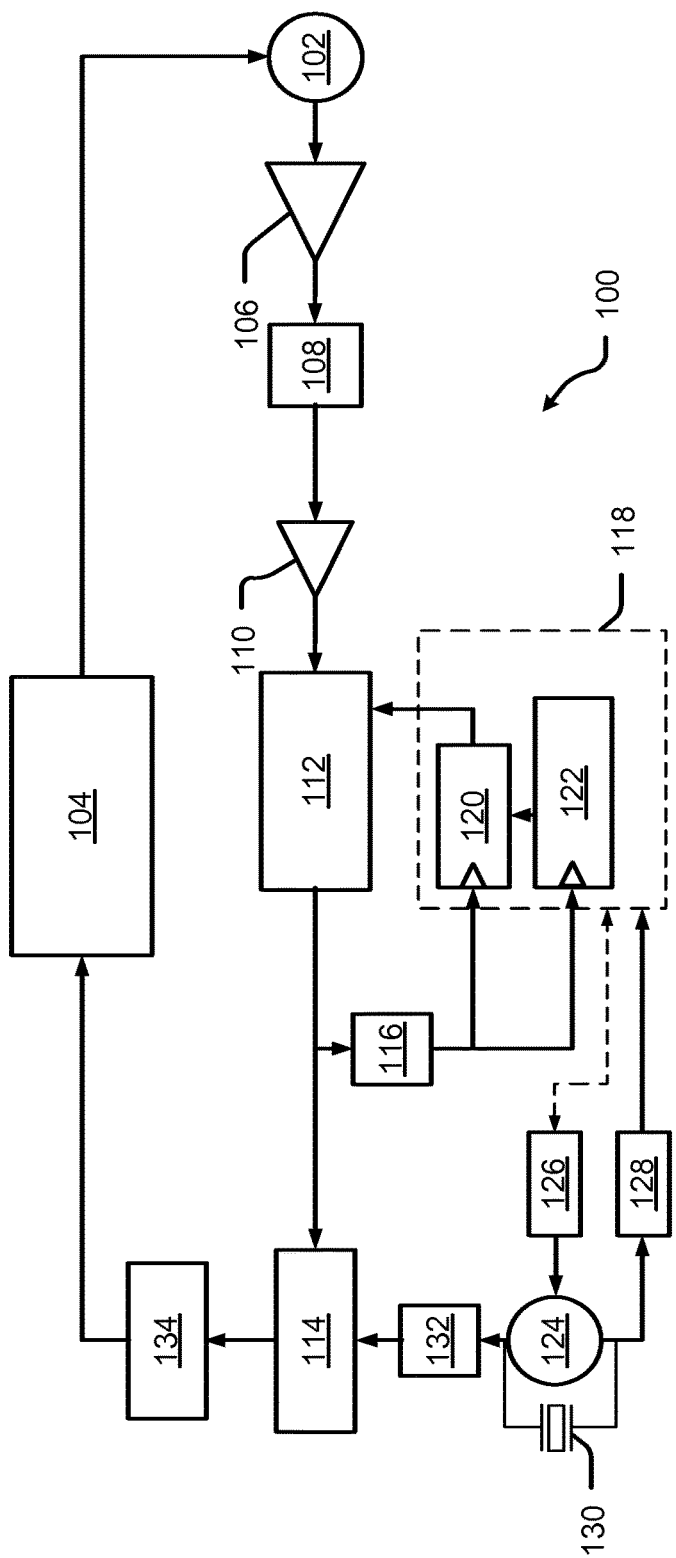
FIG. 1 is a schematic block diagram of a charge pump phase locked loop.

Because the illustrated examples may for the most part, be implemented using electronic components and circuits known to those skilled in the art, details will not be explained in any greater extent than that considered necessary, for the understanding and appreciation of the underlying concepts of the examples set forth herein and in order not to obfuscate or distract from the teachings herein.

According to a first example, there may be provided a charge pump circuit that may comprise: a first bipolar transistor device and a second bipolar switching device arranged in a differential pair configuration; a first terminal of each of the first and second bipolar switching devices may be coupled to a voltage supply; a second like terminal of each of the first and second bipolar switching devices may be coupled together and to ground potential via a pulsed current source; and a field effect switching device; wherein the first terminal of the first bipolar switching device may be coupled to the voltage supply via the field effect switching device.

The first terminal of the second bipolar switching device may be coupled to the voltage supply via a low pass filter.

The first terminal of the first bipolar switching device may also be coupled to the supply via another current source.

The field effect switching device may be coupled to the voltage supply via the another current source.

The first and second bipolar switching devices may each comprise a control terminal, together constituting differential control terminals.

According to a second example, there may be provided a charge pump apparatus that may comprise: the charge pump circuit as set forth above in relation to the first example; and a driving stage circuit that may be coupled to the charge pump circuit and arranged to translate, when in use, an emitter coupled logic signal to a ground-referenced signal.

The driving stage circuit may comprise a buffer circuit.

The driving stage circuit may comprise a ground-reference signal generation circuit coupled to the buffer circuit.

The driving stage circuit may comprise an amplifier circuit coupled to the ground-reference signal generation circuit.

According to a third example, there may be provided a phase locked loop that may comprising the charge pump circuit as set forth above in relation to the first example.

According to a fourth example, there may be provided a phase locked loop apparatus comprising the charge pump apparatus as set forth above in relation to the second example.

The apparatus may further comprise: a phase and frequency detector coupled to the driving stage circuit.

The apparatus may further comprise: a low-pass filter coupled to the charge pump circuit and a voltage controlled oscillator.

The apparatus may further comprise: a static frequency divider coupled to the voltage controlled oscillator.

The apparatus may further comprise: a programmable frequency divider; a digital controller that may have a reference frequency input and a control output; the control output may be coupled to the programmable frequency divider; wherein the programmable frequency divider may be coupled between the static frequency divider and the phase and frequency detector.

The apparatus may further comprise: a reference frequency generator coupled to the digital controller and the phase and frequency detector.

The reference frequency generator may be coupled to the phase and frequency detector via a frequency divider.

According to a fifth example, there may be provided a radar apparatus comprising: the charge pump circuit as set forth above in relation to the first example or the charge pump apparatus as set forth above in relation to the first example or the phase locked loop apparatus as set forth above in relation to the fourth example.

According to a sixth example, there may be provided an integrated circuit comprising the charge pump circuit as set forth above in relation to the first example or the charge pump apparatus as set forth above in relation to the first example or the phase locked loop apparatus as set forth above in relation to the fourth example.

According to a seventh example, there may be provided a method of manufacturing a charge pump circuit, the method may comprise: providing and arranging a first bipolar transistor device and a second bipolar switching device in a differential pair configuration; coupling a first terminal of each of the first and second bipolar switching devices to a voltage supply; coupling a second like terminal of each of the first and second bipolar switching devices together and to ground potential via a pulsed current source; and coupling the first terminal of the first bipolar switching device to the voltage supply via a field effect switching device.

Referring now to FIG. 1, a Phase Locked Loop (PLL) apparatus 100 may comprise a voltage controlled oscillator 102 coupled to a loop low-pass filter 104 and a buffer 106. The buffer 106 may be coupled to a static frequency divider 108; the static frequency divider 108 may be coupled to a programmable frequency divider 112 via another buffer 110. The programmable frequency divider 112 may be coupled to a phase and frequency detector 114, a logic converter 116 and a digital controller 118. The digital controller 118 may comprise a sigma delta modulator 120, for example a 20 bit sigma delta modulator, and a ramp signal generator 122. The logic converter 116 may be coupled to each of the sigma delta converter 120 and the ramp signal generator 122. The sigma delta modulator 120 may be coupled to the programmable frequency divider 112, constituting the coupling of the digital controller 118 to the programmable frequency divider 112. The ramp signal generator 122 may be coupled to the signal delta modulator 120.

The digital controller 118 may also be optionally coupled to a reference oscillator 124 via an Automatic Level Control (ALC) unit 126 and a differential-to-single signal converter 128. The ALC unit 126 may be coupled to an input of the reference oscillator 124 and optionally to the digital controller 118 as described above. An output of the reference oscillator 124 may be coupled to the differential-to-single signal converter 128 and the differential-to-single signal converter 128 may be coupled to the digital controller 118 as described above.

The reference oscillator 124 may comprise a crystal oscillator 130. The reference oscillator 124 may be coupled to the phase and frequency detector 114 via a divide-by-two frequency divider 132. The phase and frequency detector 114 may be coupled to the loop low-pass filter 104 via a charge pump apparatus 134.

Figure 2:
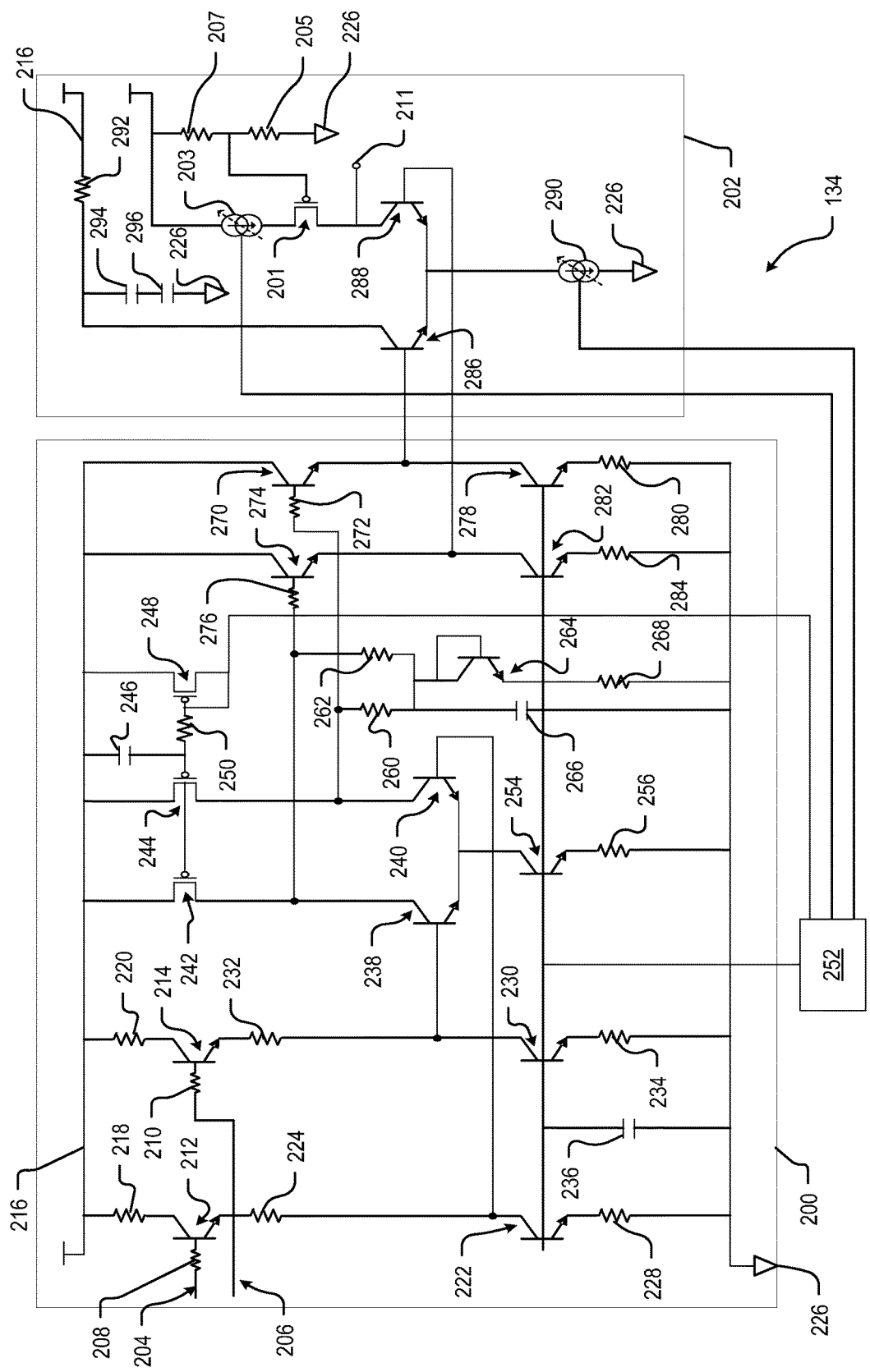
FIG. 2 is a schematic circuit diagram of a charge pump circuit and driving stage circuit used by a charge pump block of FIG. 1 and constituting an example of the present invention.

Turning to FIG. 2, the charge pump apparatus may comprise a driving stage circuit 200 and a charge pump circuit 202. The driving stage circuit 200 may comprise a first differential down signal input 204 and a second differential down signal input 206. The first down signal input 204 may be coupled to a first differential down signal output (not shown) of the phase and frequency detector 114 and the second down signal input 206 may be coupled to a second differential down signal output (not shown) of the phase and frequency detector 114. The first down signal input 204 may be coupled to a first resistance 208 and the second down signal input 206 may be coupled to a second resistance 210. The first resistance 208 may be coupled to a base terminal of a first NPN bipolar transistor 212 and the second resistance 210 may be coupled a base terminal of a second NPN bipolar transistor 214. A collector terminal of the first transistor 212 may be coupled to a voltage supply rail 216 via a third resistance 218 and a collector terminal of the second transistor 214 may be coupled to the voltage supply rail 216 via a fourth resistance 220. An emitter terminal of the first transistor 212 may be coupled to a collector terminal of a third NPN bipolar transistor 222 via a fifth resistance 224. An emitter terminal of the third transistor 222 may be coupled to a ground potential 226 via a sixth resistance 228. Similarly, an emitter terminal of the second transistor 214 may be coupled to a collector terminal of a fourth NPN bipolar transistor 230 via a seventh resistance 232 An emitter terminal of the fourth transistor 230 may be coupled to the ground potential 226 via an eighth resistance 234. Base terminals of the third and fourth transistors 222, 230 may be coupled together and to the ground potential 226 via a first capacitance 236. The above-described circuit configuration including: the first to eighth resistances 208, 210, 218, 220, 224, 228, 232, 234, the capacitance 236 and the first, second, third and fourth transistors 212, 214, 222, 230 constitute a buffer stage circuit.

A ground reference stage circuit of the driving stage circuit 200 may comprise a fifth NPN bipolar transistor 238 and a sixth NPN bipolar transistor 240 arranged in a differential pair configuration. A base terminal of the fifth transistor 238 may be coupled to the collector terminal of the fourth transistor 230 and a base terminal of the sixth transistor 240 may be coupled to the collector terminal of the third transistor 222. A collector terminal of the fifth transistor 238 may be coupled to a drain terminal of a first P-channel Metal Oxide Semiconductor Field Effect Transistor (MOSFET) 242; a source terminal of the first MOSFET 242 may be coupled to the supply rail 216. Similarly, a collector terminal of the sixth transistor 240 may be coupled to a drain terminal of a second P-channel MOSFET 244; a source terminal of the second MOSFET 244 may be coupled to the supply rail 216. A gate terminal of the first MOSFET 242 may be coupled to a gate terminal of the second MOSFET 244. The gate terminals of the first and second MOSFETs 242, 244 may also be coupled to the supply rail 216 via second capacitance 246. The gate terminals of the first and second MOSFETS 242, 244 may be coupled to a gate terminal of a third N-channel MOSFET 248 via a ninth resistance 250. The second and third MOSFETs may serve as a first current mirror. A source terminal of the third MOSFET 248 may be coupled to the supply rail 216 and a drain terminal of the third MOSFET 248 may be coupled to a bias circuit 252. Emitter terminals of the fifth and sixth transistors 238, 240 may be coupled to a collector terminal of a seventh NPN bipolar transistor 254. An emitter terminal of the seventh transistor 254 may be coupled to the ground potential 226 via a tenth resistance 256.

The collector terminal of the sixth transistor 240 may be coupled to first terminals of an eleventh resistance 260; a second terminal of the eleventh resistance 260 may be coupled to a collector terminal of an eighth NPN bipolar transistor 264 and to the ground potential via a third capacitance 266. A base terminal of the seventh transistor 264 may be coupled to the collector terminal thereof. An emitter terminal of the seventh transistor 264 may be coupled to the ground potential via a thirteenth resistance 268.

An amplifier circuit stage may comprise the first terminal of the eleventh resistance 260 being coupled to a base terminal of a ninth NPN bipolar transistor 270 via a fourteenth resistance 272. A first terminal of a twelfth resistance 262 may be coupled to the collector terminal of the fifth transistor 238 and a base terminal of a tenth NPN bipolar transistor 274 via a fifteenth resistance 276. A second terminal of the twelfth resistance 262 may be coupled to the collector terminal of the eighth transistor 264. Collector terminals of the ninth and tenth transistors 270, 274 may be coupled to the supply rail 216. An emitter terminal of the ninth transistor 270 may be coupled to a collector terminal of an eleventh NPN bipolar transistor 278. An emitter terminal of the eleventh transistor 278 may be coupled to the ground potential 226 via a sixteenth resistance 280. An emitter terminal of the tenth transistor 274 may be coupled to a collector terminal of a twelfth NPN bipolar transistor 282. An emitter terminal of the twelfth transistor 282 may be coupled to the ground potential 226 via a seventeenth resistance 284. Base terminals of the eleventh and twelfth transistors 278, 282 may be coupled to the base terminals of the third, fourth and seventh transistors 222, 230, 254 and the bias circuit 252.

The emitter terminals of the ninth and tenth transistors 270, 274 may be coupled to the charge pump circuit 202. In this respect, the charge pump circuit 202 may comprise a thirteenth NPN bipolar transistor 286 and a fourteenth NPN bipolar transistor 288 arranged in a differential pair configuration. A base terminal of the thirteenth transistor 286 may be coupled to the emitter terminal of the ninth transistor 270 and a base terminal of the fourteenth transistor 288 may be coupled to the emitter terminal of the tenth transistor 274; the base terminals of the thirteenth transistor 286 and the fourteenth transistor 288 may constitute differential control terminals. Emitter terminals of the thirteenth and fourteenth transistors 286, 288 may be coupled to the ground potential 226 via a pulsed current source 290; the pulsed current source may be coupled to the bias circuit 252.

A collector terminal of the thirteenth transistor 286 may be coupled to a trickle current supply rail 291 via an eighteenth resistance 292. The collector terminal of the thirteenth transistor 286 may also be coupled to the ground potential 226 via a fourth capacitance 294 and a fifth capacitance 296 coupled in series. A collector terminal of the fourteenth transistor 288 may be coupled to a drain terminal of a fourth P-channel MOSFET 201. An output 211 for coupling to the low-pass filter 104 may also be taken from the collector terminal of the fourteenth transistor 288. A source terminal of the fourth MOSFET 201 may be coupled to the trickle current supply rail 291 via a trickle current source 203; the trickle current source 203 may be coupled to the bias circuit 252. A gate terminal of the fourth MOSFET 201 may be coupled to a potential divider. In this respect, the gate terminal of the fourth MOSFET 201 may be coupled to the ground potential 226 via a nineteenth resistance 205 and to the trickle current supply rail 291 via a twentieth resistance 207.

Figure 3:
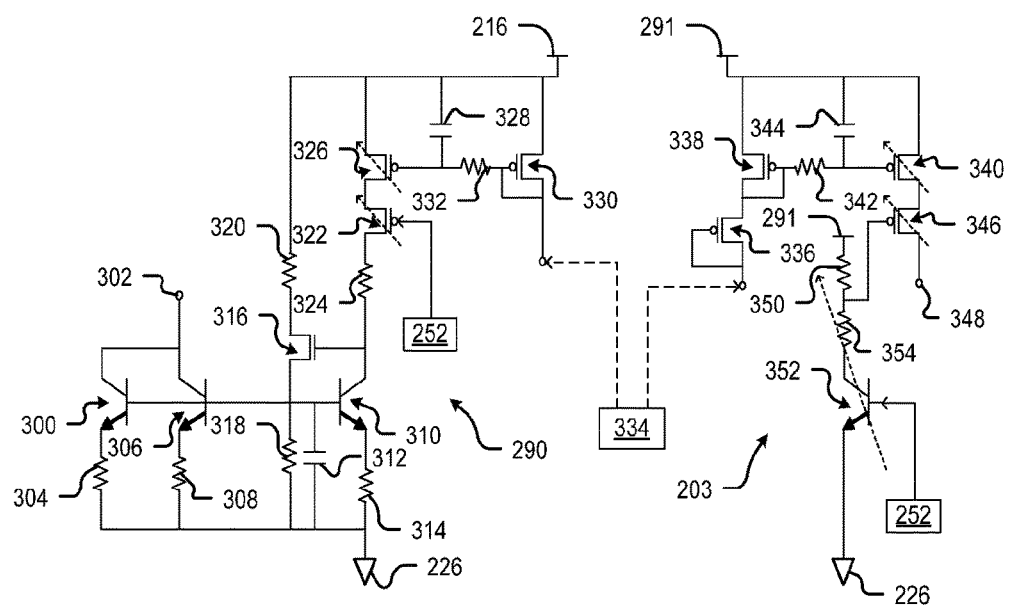
FIG. 3 is a schematic circuit diagram of current sources of the charge pump circuit of FIG. 2.

Referring to FIG. 3, the pulsed current source 290 may comprise a fifteenth NPN bipolar transistor 300 that may have a collector terminal coupled to a first coupling terminal 302 for coupling to the emitter terminals of the thirteenth and fourteenth transistors 286, 288. An emitter of the fifteenth transistor 300 may be coupled to the ground potential 226 via a twenty-first resistance 304. A base terminal of the fifteenth transistor 300 may be coupled to a base terminal of a sixteenth NPN bipolar transistor 306. A collector terminal of the sixteenth transistor 306 may also be coupled to the first coupling terminal 302. An emitter terminal of the sixteenth transistor 306 may be coupled to the ground potential 226 via a twenty-second resistance 308. The base terminal of the sixteenth transistor 306 may also be coupled to a base terminal of a seventeenth NPN bipolar transistor 310 and the ground potential 226 via a sixth capacitance 312. An emitter terminal of the seventeenth transistor 310 may be coupled to the ground potential via a twenty-third resistance 316.

A collector terminal of seventeenth transistor 310 may be coupled to a gate terminal of a fifth N-channel MOSFET 316; a source terminal of the fifth MOSFET may be coupled to the ground potential 226 via a twenty-fourth resistance 318 and a drain terminal of the fifth MOSFET 316 may be coupled to the supply rail 216 via a twenty-fifth resistance 320. The collector terminal of the seventeenth transistor 310 may also be coupled to a drain terminal of a sixth P-channel MOSFET 322 via a twenty-sixth resistance 324. A source terminal of the sixth MOSFET 322 may be coupled to a drain terminal of a seventh P-channel MOSFET 326; a source terminal of the seventh MOSFET 326 may be coupled to the supply rail 216. A gate terminal of the sixth MOSFET 322 may be coupled to the bias circuit 252 and the gate terminal of the seventh MOSFET 326 may be coupled to the supply rail 216 via a seventh capacitance 328 and a gate terminal of an eighth P-channel MOSFET 330 via a twenty-seventh resistance 332. A source terminal of the eighth MOSFET 330 may be coupled to the supply rail 216 and a drain terminal of the eighth MOSFET 330 may be coupled to the gate terminal thereof and to a bandgap current generator 334.

Turning to the trickle current source 203, this circuit may comprise a ninth P-channel MOSFET 336 that may have a drain terminal coupled to a gate terminal thereof and the bandgap current generator 334. A source terminal of the ninth MOSFET 336 may be coupled to a source terminal of a tenth P-channel MOSFET 338. A source terminal of the tenth MOSFET 338 may be coupled to the trickle current supply rail 291 and the gate terminal of the tenth MOSFET 338 may be coupled to the drain terminal thereof and a gate terminal of an eleventh P-channel MOSFET 340 via a twenty-eighth resistance 342; the gate terminal of the eleventh MOSFET 340 may also be coupled to the trickle current supply rail 291 via an eighth capacitance 344. A source terminal of the eleventh MOSFET 340 may also be coupled to the trickle current supply rail 291. A drain terminal of the eleventh MOSFET 340 may be coupled to a source terminal of a twelfth P-channel MOSFET 346; a drain terminal of the twelfth MOSFET 346 may be coupled to a second coupling terminal 348 for coupling to the source terminal of the fourth MOSFET 201. A gate terminal of the twelfth MOSFET 346 may be coupled to another potential divider. In this respect, the gate terminal of the twelfth MOSFET 346 may be coupled to the trickle current supply rail 291 via a twenty-ninth resistance 350. The gate terminal of the twelfth MOSFET 346 may also be coupled to a collector terminal of an eighteenth NPN bipolar transistor 352 via a thirtieth resistance 354. An emitter terminal of the eighteenth transistor 352 may be coupled to the ground potential 226 and the base terminal of the eighteenth transistor 352 may be coupled to the bias circuit 252.

In operation, the PLL apparatus 100 may be powered up, usually as part of a larger circuit to serve a desired application, for example a radar transmitter. As the PLL apparatus 100 operates in a known manner for charge pump PLLs, further explanation of the operation of the PLL apparatus 100 will not be described so as not to distract from the main teachings of the examples of the invention set forth herein.

Turning to the charge pump apparatus 134 control signals are received from the phase and frequency detector 114 in the form of a first differential down signal and a second differential down signal respectively applied to the first down signal input 204 and the second down signal input 206 in response to input signals received by the phase and frequency detector 114 from the divide-by-two frequency divider 132 and the programmable frequency divider 112 during operation of the PLL apparatus 100. In this example, an up signal generation capability of the phase and frequency detector 114 is not used.

The first differential down signal and the second differential down signal are Emitter-Coupled Logic (ECL) compliant signals. However, in order to drive the charge pump circuit 202, the charge pump circuit 202 may need to be provided with ground-referenced driving signals. As such, the driving stage circuit 200 may translate the first differential down signal and the second differential down signal from being ECL compliant signals to being ground-referenced signals. In this respect, the buffer stage circuit described above serves to shift the received ground-referenced signal down to a lower level, for example about 0.7V corresponding to a voltage drop across a PN junction. Thereafter, the buffered first differential down signal and the buffered second differential down signal are converted to ground-referenced first and second differential down signals by the ground reference stage circuit described above. The second and third MOSFETs 244, 248 constitute a current mirror that, in conjunction with the fifth and sixth transistors 238, 240 arranged in the differential pair configuration, serve to translate the ECL compliant signals to ground-referenced signals. Noise generated by the bias circuit 252 is supressed by the ninth resistance 250 and the second capacitance 246, which operate together as a low-pass filter, thereby providing compliance with a noise specification for the PLL apparatus 100. Thereafter, the ground-referenced first and second differential down signals are applied to the amplifier stage circuit in order to amplify the ground-referenced first and second differential down signals prior to application at the charge pump circuit 202, namely at the base terminals of the thirteenth and fourteenth transistors 286, 288. The amplification may be required in order to drive the pulsed current source 290.

Turning to the charge pump circuit 202, the differential pair configuration provides a first branch that comprises a second low-pass filter formed from the eighteenth resistance 292 and the fourth and fifth capacitances 294, 296. The first branch serves as "dummy" path in order to avoid charge injection into a second branch provided by the differential pair configuration and comprising the trickle current source 203. The provision of the trickle current source 203 may enable the locking operation of the charge pump PLL. Noise from the trickle current generated by the trickle current source 203 may be filtered out to comply with a noise specification of the PLL. This is achieved by maintaining a constant DC ratio between the trickle current generated by the trickle current source 203 and the pulsed current source 290. The pulsed current source 290 is pulsed by application of the amplified ground-referenced first and second differential signals provided by the driving circuit 200 to drive the thirteenth and fourteenth transistors 286, 288 of the differential pair configuration. An output signal is then provided at the output 211, which is applied to the low-pass filter 104 of FIG. 1.

Turning to the pulsed current source 290 and the trickle current source 203 of FIG. 3, the pulsed current source 290 may comprise a second current mirror formed by the seventh and eighth MOSFETs 326, 330. The pulsed current source may also comprise a third current mirror formed from the fifteenth, sixteen and seventeenth transistors 300, 306, 310. The bandgap current generator 334 may generate a constant current that is invariant over a given temperature range, for example a temperature range associated with an automotive vehicle. However, in order to suppress noise from the bandgap current generator 334, the second current mirror may comprise a third low-pass filter formed by the seventh capacitor 328 and the twenty-seventh resistance 332. In operation, current may be generated using the sixth, seventh and eighth MOSFETs 322, 326, 330 under the control of the bias circuit 252. The fifteenth, sixteenth and seventeenth bipolar transistors 300, 306, 310 are employed in order to reduce the output capacitance of the second current mirror.

In operation, the pulsed current source 290 generates a logic HIGH output current signal in response to a ground-referenced signal generated by the circuit 200 being at a logic HIGH level, and a logic LOW output current signal when the ground-referenced signal generated by the circuit 200 is at a logic LOW level, i.e. the output generated by the pulsed current source 290 follows the ground-referenced signal of the circuit 200.

The trickle current source 203 may comprise a fourth current mirror formed from the tenth and eleventh MOSFETs 338, 340. Again, in order to suppress noise from the bandgap current generator 334, the fourth current mirror may comprise a fourth low-pass filter formed by the eighth capacitance 344 and the twenty-eighth resistance 342. In operation, current may be generated using the tenth, eleventh and twelfth MOSFETs 338, 340, 346 operating with a 5V supply voltage and under the control of the bias circuit 252. The trickle current may be a predetermined constant current.

The trickle current source 203 and the pulsed current source 290 are controlled by a DAC of the bias circuit 252, for example a 6 bit DAC, which may generate the ground-referenced current in order to calibrate the bandwidth of the PLL apparatus 100.

It is thus possible to provide a charge pump circuit, phase locked loop apparatus, and integrated circuit that are capable of supporting high speed operation whilst exhibiting very low noise characteristics over a wide tuning range at a relatively high voltage range, for example between about 0.5 V and about 5V. The use of a BICMOS implementation for both the driving stage circuit 200 and the charge pump circuit 202 assists in the provision of these benefits. The slew rate of current signals provided at the output of the charge pump circuit are also improved.

Of course, the above advantages are examples, and these or other advantages may be achieved by the examples set forth herein. Further, the skilled person will appreciate that not all advantages stated above are necessarily achieved by embodiments described herein.

In the foregoing specification, the invention has been described with reference to specific examples of embodiments of the invention. It will, however, be evident that various modifications and changes may be made therein without departing from the broader scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, blocks set forth in FIG. 1 can be combined depending upon design convenience and the topology set forth in these figures is not intended to be limiting in any way.

References made herein to "transistors" should be understood to be embrace any suitable switching device. Likewise, references to gate terminals and base terminals herein should be understood to extend to references to any suitable control terminal.

Although certain families of switching device, for example NPN transistors and P-channel FETs have been used herein for exemplary purposes and the skilled person will readily understand that complementary technologies may be employed, for example PNP transistors and N-channel FETs.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

The examples set forth herein, or portions thereof, may be implemented as soft or code representations of physical circuitry or of logical representations convertible into physical circuitry, such as in a hardware description language of any appropriate type.

Also, the embodiments set forth herein are not limited to physical devices or units implemented in non-programmable hardware but can also be applied in programmable devices or units able to perform the desired device functions by operating in accordance with suitable program non-transitory code, such as mainframes, minicomputers, servers, workstations, personal computers, notepads, personal digital assistants, commonly denoted as 'computer systems'.

Other modifications, variations and alternatives to the examples set forth herein are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A charge pump circuit comprising:
    a first bipolar switching device and a second bipolar switching device arranged in a differential pair configuration;
    a first terminal of each of the first and second bipolar switching devices coupled to a voltage supply;
    a second like terminal of each of the first and second bipolar switching devices being coupled directly together at a circuit node, wherein the circuit node is coupled to ground potential via a pulsed current source; and
    a field effect switching device, wherein the first terminal of the first bipolar switching device is coupled to the voltage supply via the field effect switching device.

2. A charge pump circuit as claimed in claim 1, wherein the first terminal of the second bipolar switching device is coupled to the voltage supply via a low pass filter.

3. A charge pump circuit as claimed in claim 1, wherein the first terminal of the first bipolar switching device is also coupled to the supply via another current source.

4. A charge pump circuit as claimed in claim 3, wherein the field effect switching device is coupled to the voltage supply via the another current source.

5. A charge pump circuit as claimed in claim 1, wherein the first and second bipolar switching devices each comprise a control terminal, together constituting differential control terminals.

6. An apparatus comprising the charge pump circuit as claimed in claim 1, further comprising:
    a driving stage circuit coupled to the charge pump circuit and arranged to translate, when in use, an emitter coupled logic signal to a ground-referenced signal.

7. An apparatus, comprising:
    a charge pump circuit having:
        a first bipolar switching device and a second bipolar switching device arranged in a differential pair configuration;
        a first terminal of each of the first and second bipolar switching devices coupled to a voltage supply;
        a second like terminal of each of the first and second bipolar switching devices being coupled together and to ground potential via a pulsed current source; and a field effect switching device, wherein the first terminal of the first bipolar switching device is coupled to the voltage supply via the field effect switching device;

a driving stage circuit coupled to the charge pump circuit and arranged to translate, when in use, an emitter coupled logic signal to a ground-referenced signal, wherein the driving stage circuit comprises a buffer circuit.

8. An apparatus as claimed in claim 7, wherein the driving stage circuit comprises a ground-reference signal generation circuit coupled to the buffer circuit.

9. An apparatus as claimed in claim 8, wherein the driving stage circuit comprises an amplifier circuit coupled to the ground-reference signal generation circuit.

10. An apparatus as claimed in claim 1, wherein the charge pump circuit is implemented in a phase locked loop.

11. An apparatus as claim in claim 6, wherein the charge pump circuit is implemented in a phase locked loop apparatus.

12. An apparatus as claimed in claim 11, further comprising:

a phase and frequency detector coupled to the driving stage circuit.

13. An apparatus as claimed in claim 12, further comprising:

a low-pass filter coupled to the charge pump circuit and a voltage controlled oscillator.

14. An apparatus as claimed in claim 13, further comprising:

a static frequency divider coupled to the voltage controlled oscillator.

15. An apparatus as claimed in claim 14, further comprising:

a programmable frequency divider;

a digital controller having a reference frequency input and a control output, the control output being coupled to the programmable frequency divider; wherein the programmable frequency divider is coupled between the static frequency divider and the phase and frequency detector.

16. An apparatus as claimed in claim 15, further comprising:

a reference frequency generator coupled to the digital controller and the phase and frequency detector.

17. An apparatus as claimed in claim 16, wherein the reference frequency generator is coupled to the phase and frequency detector via a frequency divider.

18. An apparatus as claim in claim 1, wherein the apparatus is implemented in a radar apparatus.

19. A method of manufacturing a charge pump circuit, the method comprising:

providing and arranging a first bipolar switching device and a second bipolar switching device in a differential pair configuration;

coupling a first terminal of each of the first and second bipolar switching devices to a voltage supply;

coupling a second like terminal of each of the first and second bipolar switching devices directly together at a circuit node;

coupling the circuit node to ground potential via a pulsed current source; and coupling the first terminal of the first bipolar switching device to the voltage supply via a field effect switching device.

* * * * *